United States Patent
Bhavnagarwala et al.

(10) Patent No.: US 10,049,735 B2
(45) Date of Patent: *Aug. 14, 2018

(54) METHOD, SYSTEM AND DEVICE FOR COMPLEMENTARY NON-VOLATILE MEMORY DEVICE OPERATION

(71) Applicant: ARM Ltd., Cambridge (GB)

(72) Inventors: Azeez Bhavnagarwala, Newtown, CT (US); Robert Campbell Aitken, San Jose, CA (US); Lucian Shifren, San Jose, CA (US)

(73) Assignee: ARM Ltd., Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/416,799

(22) Filed: Jan. 26, 2017

(65) Prior Publication Data

US 2017/0213592 A1 Jul. 27, 2017

Related U.S. Application Data

(63) Continuation of application No. 14/862,040, filed on Sep. 22, 2015, now Pat. No. 9,589,636.

(51) Int. Cl.
*G11C 13/00* (2006.01)

(52) U.S. Cl.
CPC ...... *G11C 13/0069* (2013.01); *G11C 13/0002* (2013.01); *G11C 13/003* (2013.01); *G11C 13/004* (2013.01); *G11C 13/0007* (2013.01); *G11C 13/0011* (2013.01); *G11C 2013/0054* (2013.01); *G11C 2213/75* (2013.01)

(58) Field of Classification Search
CPC .................................................. G11C 13/004
USPC ........................................................ 365/148
See application file for complete search history.

(56) References Cited

U.S. PATENT DOCUMENTS

| | | | |
|---|---|---|---|
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2* | 1/2011 | Paz de Araujo | H01L 45/04 365/148 |
| 8,456,892 B2* | 6/2013 | Yasuda | G11C 13/0004 365/148 |
| 8,674,724 B2* | 3/2014 | Nazarian | H03K 19/1776 326/39 |
| 8,754,671 B2* | 6/2014 | Nazarian | H01L 27/101 326/39 |

(Continued)

FOREIGN PATENT DOCUMENTS

WO  WO2008058264 A2  5/2008

OTHER PUBLICATIONS

International Search Report, dated Dec. 7, 2016, International Application No. PCT/GB2016/052942, 5 pgs.
Written Opinion of the International Searching Authority, dated Dec. 7, 2016, International Application No. PCT/GB2016/052942, 9 pgs.

(Continued)

*Primary Examiner* — Son Mai
(74) *Attorney, Agent, or Firm* — Berkeley Law & Technology Group, LLP

(57) ABSTRACT

Disclosed are methods, systems and devices for operation of dual non-volatile memory devices. In one aspect, a pair of non-volatile memory device coupled in series may be placed in complementary memory states any one of multiple memory states in a write operation by controlling a current and a voltage applied to terminals of the non-volatile memory device.

21 Claims, 3 Drawing Sheets

(56) References Cited

U.S. PATENT DOCUMENTS

| | | | |
|---|---|---|---|
| 9,191,000 | B2 | 11/2015 | Nazarian |
| 9,230,641 | B2* | 1/2016 | Sekar ................. G11C 13/0002 |
| 9,318,158 | B2* | 4/2016 | Baker, Jr. ................. G11O 5/06 |
| 9,589,636 | B1* | 3/2017 | Bhavnagarwala . G11C 13/0002 |
| 2008/0107801 | A1 | 5/2008 | Celinska |
| 2009/0316471 | A1 | 12/2009 | Tsuchida |
| 2012/0075910 | A1 | 3/2012 | Yasuda |
| 2012/0243297 | A1* | 9/2012 | Katayama ........... G11C 11/1659 |
| | | | 365/148 |
| 2013/0027081 | A1 | 1/2013 | Nazarian et al. |
| 2013/0285699 | A1 | 10/2013 | McWilliams |
| 2014/0063996 | A1 | 3/2014 | Takahashi |
| 2014/0269006 | A1 | 9/2014 | Sekar et al. |
| 2015/0138877 | A1 | 5/2015 | Nebashi |
| 2015/0248936 | A1 | 11/2015 | Best |
| 2015/0348595 | A1 | 12/2015 | Baker, Jr. et al. |
| 2016/0055906 | A1 | 2/2016 | Ho |

OTHER PUBLICATIONS

Wen Chao Shen et al., "Memristor Logic Operation Gate With Share Contact RRAM Cell", vol. 32, No. 12, Oct. 13, 2011, IEEE Service Ctr., NY, NY, pp. 1650-1652.
International Search Report, dated Dec. 14, 2016, International Application No. PCT/GB2016/052941, 5 pages.
Written Opinion of the International Searching Authority, dated Dec. 14, 2016, International Application No. PCT/GB2016/052941, 9 pages.
U.S. Appl. No. 14/862,023, filed Sep. 22, 2015, 45 pages.
U.S. Appl. No. 15/387,061, filed Dec. 21, 2016, 46 pages.
U.S. Appl. No. 14/862,040, filed Sep. 22, 2015, 42 pages.
International Preliminary Report on Patentability, International Application No. PCT/GB2016/052942, dated Apr. 5, 2018, 2 pgs.
Written Opinion of the International Searching Authority, International Application No. PCT/GB2016/052942, dated Apr. 5, 2018, 8 pgs.
U.S. Appl. No. 15/989,879, Application and Preliminary Amendment filed May 25, 2018, 60 pgs.

* cited by examiner

METHOD, SYSTEM AND DEVICE FOR COMPLEMENTARY NON-VOLATILE MEMORY DEVICE OPERATION

CROSS REFERENCE TO RELATED APPLICATIONS

This application is related to U.S. patent application Ser. No. 14/862,023, titled "METHOD, SYSTEM AND DEVICE FOR COMPLEMENTARY NON-VOLATILE MEMORY DEVICE OPERATION," filed on Sep. 22, 2015, and is a continuation of U.S. patent application Ser. No. 14/862,040 titled "METHOD, SYSTEM AND DEVICE FOR COMPLEMENTARY NON-VOLATILE MEMORY DEVICE OPERATION," filed on Sep. 22, 2015, both of which are incorporated herein by reference in its entirety.

BACKGROUND

1. Field

Disclosed are techniques for utilizing memory devices.

2. Information

Non-volatile memories are a class of memory in which the memory cell or element does not lose its state after power supplied to the device is removed. The earliest computer memories, made with rings of ferrite that could be magnetized in two directions, were non-volatile, for example. As semiconductor technology evolved into higher levels of miniaturization, the ferrite devices were abandoned for the more commonly known volatile memories, such as DRAMs (Dynamic Random Access Memories) and SRAMs (Static-RAMs).

One type of non-volatile memory, electrically erasable programmable read-only memory (EEPROM) devices have large cell areas and may require a large voltage (e.g., from 12.0 to 21.0 volts) on a transistor gate to write or erase. Also, an erase or write time is typically of the order of tens of microseconds. One limiting factor with EEPROMs is the limited number of erase/write cycles to no more than slightly over 600,000—or of the order of $10^5$-$10^6$. The semiconductor industry has eliminated a need of a pass-gate switch transistor between EEPROMs and non-volatile transistors by sectorizing a memory array in such a way that "pages" (e.g., sub-arrays) may be erased at a time in EEPROMs called flash memory devices. In flash memory devices, an ability to keep random access (erase/write single bits) was sacrificed for speed and higher bit density.

More recently, FeRAMs (Ferroelectric RAMs) have provided low power, relatively high write/read speed, and endurance for read/write cycles exceeding 10 billion times. Similarly, magnetic memories (MRAMs) have provided high write/read speed and endurance, but with a high cost premium and higher power consumption. Neither of these technologies reaches the density of flash memory devices, for example. As such, flash remains a non-volatile memory of choice. Nevertheless, it is generally recognized that flash memory technology may not scale easily below 65 nanometers (nm); thus, new non-volatile memory devices capable of being scaled to smaller sizes are actively being sought.

Technologies considered for the replacement of flash memory devices have included memories based on certain materials that exhibit a resistance change associated with a change of phase of the material (determined, at least in part, by a long range ordering of atoms in the crystalline structure). In one type of variable resistance memory called a phase change memory (PCM/PCRAM) devices, a change in resistance occurs as the memory element is melted briefly and then cooled to either a conductive crystalline state or a non-conductive amorphous state. Typical materials vary and may include GeSbTe, where Sb and Te can be exchanged with other elements of the same or similar properties on the Periodic Table. However, these resistance-based memories have not proved to be commercially useful because their transition between the conductive and the insulating state depends on a physical structure phenomenon (e.g., melting at up to 600 degrees C.) and returning to a solid state that cannot be sufficiently controlled for a useful memory in many applications.

Another variable resistance memory category includes materials that respond to an initial high "forming" voltage and current to activate a variable resistance function. These materials may include, for example, $Pr_xCa_yMn_zO_\epsilon$, with x, y, z and ε of varying stoichiometry; transition metal oxides, such as CuO, CoO, $VO_x$, NiO, $TiO_2$, $Ta_2O_5$; and some perovskites, such as Cr; $SrTiO_3$. Several of these memory types exist and fall into the resistive RAMs (ReRAMs) or conductive bridge RAMS (CBRAM) classification, to distinguish them from the chalcogenide type memories. It is postulated that resistance switching in these RAMs is due, at least in part, to the formation of narrow conducting paths or filaments connecting the top and bottom conductive terminals by the electroforming process, though the presence of such conducting filaments are still a matter of controversy. Since operation of a ReRAM/CBRAM may be strongly temperature dependent, a resistive switching mechanism in a ReRAM/CBRAM may also be highly temperature dependent. Additionally, these systems may operate stochastically as the formation and movement of the filament is stochastic. Other types of ReRAM/CBRAM may also exhibit unstable qualities. Further, resistance switching in ReRAM/CBRAMs tends to fatigue over many memory cycles. That is, after a memory state is changed many times, a difference in resistance between a conducting state and an insulative state may change significantly. In a commercial memory device, such a change may take the memory out of specification and make it unusable.

Given an inherent difficulty in forming a thin film resistance switching material that is stable over time and temperature, a workable resistance switching memory remains a challenge. Furthermore, all resistance switching mechanisms developed up to now have been inherently unsuitable for memories, due to high currents, electroforming, no measurable memory read or write windows over a reasonable range of temperatures and voltages, and many other problems such as stochastic behavior. Thus, there remains a need in the art for a non-volatile memory that is deterministic has low power, high speed, high density and stability, and in particular, such a memory that is scalable to feature sizes well below 65 nanometers (nm).

DETAILED DESCRIPTION

Figure 1A:
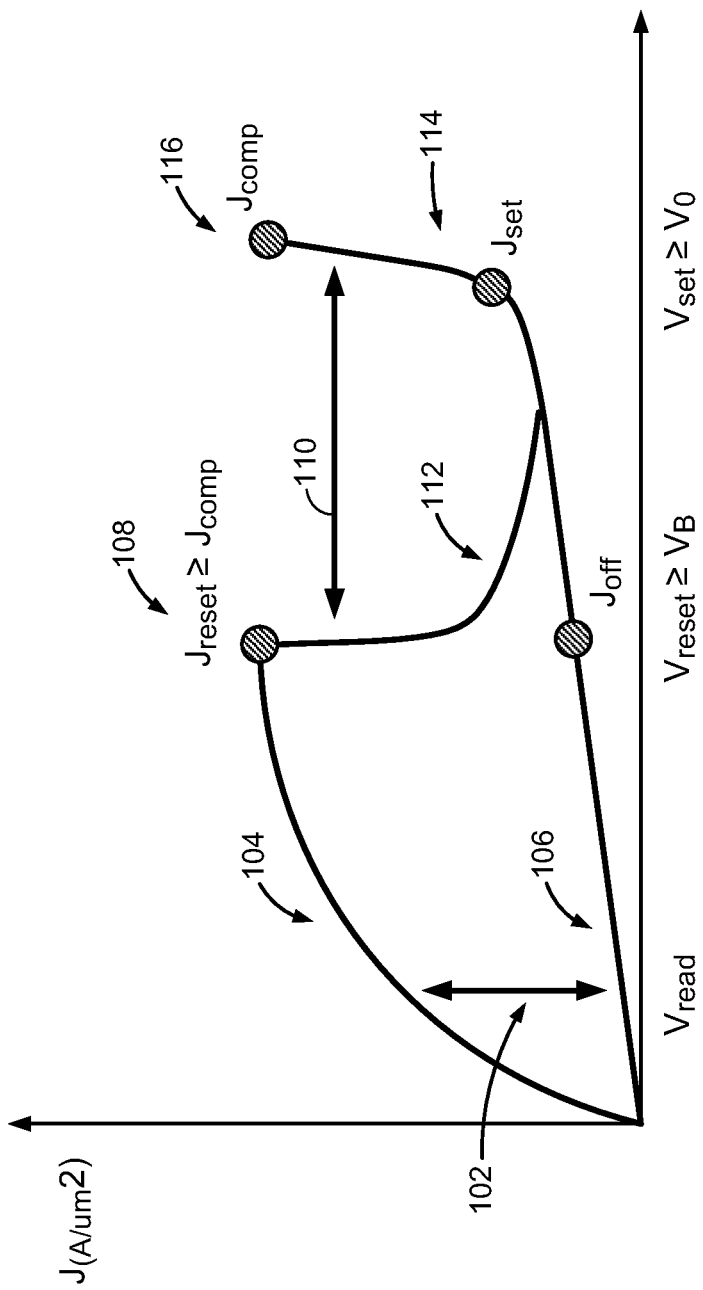
FIG. 1A shows a plot of current density versus voltage for a CES device according to an embodiment.

Particular aspects of the present disclosure incorporate a Correlated Electron Material (CEM) to form a correlated electron switch (CES). In this context, a CES may exhibit an abrupt conductor/insulator transition arising from electron correlations rather than solid state structural phase changes (e.g., crystalline/amorphous in phase change memory (PCM) devices or filamentary formation and conduction in resistive RAM devices as discussed above). In one aspect, an abrupt conductor/insulator transition in a CES may be responsive to a quantum mechanical phenomenon, in contrast to melting/solidification or filament formation. Such a quantum mechanical transition between conductive and insulative states in a CEM memory device may be understood in any one of several aspects.

In one aspect, a quantum mechanical transition of a CES between an insulative state and a conductive state may be understood in terms of a Mott transition. In a Mott transition, a material may switch from an insulative state to conductive state if a Mott transition condition occurs. The criteria may be defined by the condition $(n_C)^{1/3} a=0.26$, where $n_C$ is a concentration of electrons and "a" is a Bohr radius. If a critical carrier concentration is achieved such that the Mott criteria is met, a Mott transition may occur and state may change from a high resistance/capacitance to a low resistance/capacitance.

In one aspect, a Mott transition may be controlled by a localization of electrons. As carriers are localized, a strong coulomb interaction between electrons splits the bands of the material creating an insulator. If electrons are no longer localized, a weak coulomb interaction may dominate band splitting, leaving behind a metal (conductive) band. This is sometimes explained as a "crowded elevator" phenomenon. While an elevator has only a few people in it, the people can move around easily, which is analogous to a conducting state. While the elevator reaches a certain concentration of people, on the other hand, passengers can no longer move, which is analogous to the insulative state. However, it should be understood that this classical explanation provided for illustrative purposes, like all classical explanations of quantum phenomenon, is only an incomplete analogy, and that claimed subject matter is not limited in this respect.

In particular implementations of aspects of this disclosure, a resistive switching integrated circuit memory may comprise: a resistive switching memory cell including a CES device; a write circuit for placing the resistive switching memory cell in a first resistive state or a second resistive state depending on signals provided to the memory device, wherein a resistance of a CES is higher in the second resistance state than in the first resistance state; and a read circuit for sensing the state of the memory cell and providing an electrical signal corresponding to the sensed state of the memory cell. In one aspect, a resistance of a CES in the second memory cell state may be more than 100 times the resistance in the second memory cell state. In a particular implementation, a CES device may switch resistive states responsive to a Mott-transition in the majority of the volume of the CES device. In one aspect, a CES device may comprise a material selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

In a particular embodiment, a CES device may be formed as a "CEM random access memory (CeRAM)" device. In this context, a CeRAM device comprises a material that may transition between or among a plurality of predetermined detectable memory states based, at least in part, on a transition of at least a portion of the material between a conductive state and an insulative state utilizing the quantum mechanical Mott transition. In this context, a "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive state and insulative memory states. As discussed in the particular example implementations below, material of a CES element sandwiched between conductive terminals may be placed in an insulative or high impedance memory state by application of a first programming signal across the terminals having a voltage $V_{reset}$ and current $I_{reset}$, or placed in a conductive or low impedance memory state by application of a second programming signal across the terminals having a voltage $V_{set}$ and current $I_{set}$. In this context, it should be understood that terms such as "conductive or low impedance" memory state and "insulative or high impedance" memory state are relative terms and not specific to any particular quantity or value for impedance or conductance. For example, while a memory device is in a first memory state referred to as an insulative or high impedance memory state the memory device in one aspect is less conductive (or more insulative) than while the memory device in a second memory state referred to as a conductive or low impedance memory state.

In a particular implementation, CeRAM memory cells may comprise a metal/CEM/metal (M/CEM/M) stack formed on a semiconductor. Such an M/CEM/M stack may be formed on a diode, for example. In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1A shows a plot of current density versus voltage across terminals (not shown) for a CES device according to an embodiment. Based, at least in part, on a voltage applied to terminals of the CES device (e.g., in a write operation), the CES may be placed in a conductive state or an insulative state. For example application of a voltage $V_{set}$ and current density $J_{set}$ may place the CES device in a conductive memory state and application of a voltage $V_{reset}$ and a current density $J_{reset}$ may place the CES device in an insulative memory state. Following placement of the CES in an insulative state or conductive state, the particular state of the CES device may be detected by application of a voltage $V_{read}$ (e.g., in a read operation) and detection of a current or current density at terminals of the CES device.

According to an embodiment, the CES device of FIG. 1A may be formed from a variable resistance material that switches from a first resistive state to a second resistive state, with the second resistive state having a resistance at least ten times higher than the first resistance state, and the change in resistance being primarily arising from electron localization as discussed above. In particular implementations, variable resistance materials of a CES device may include any TMO, such as, for example, perovskites, Mott insulators, charge exchange insulators, and Anderson disorder insulators. In particular implementations, a CES device may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES device may be prepared without electroforming. Other implementations may employ other transition metal compounds without deviating from claimed subject matter. For example, {M(chxn)$_2$Br}Br$_2$ where M may comprise Pt, Pd, or Ni, and chxn comprises 1 R,2R-cyclohexanediamine, and other such metal complexes may be used without deviating from claimed subject matter.

In one aspect, the CES device of FIG. 1A may comprise materials that are TMO metal oxide variable resistance materials, though it should be understood that these are exemplary only, and are not intended to limit claimed subject matter. Particular implementations may employ other variable resistance materials as well. Nickel oxide, NiO, is disclosed as one particular TMO. NiO materials discussed herein may be doped with extrinsic ligands, which may stabilize variable resistance properties. In particular, NiO variable resistance materials disclosed herein may include a carbon containing ligand, which may be indicated by NiO(C$_x$). Here, one skilled in the art may determine a value of x for any specific carbon containing ligand and any specific combination of carbon containing ligand with NiO simply by balancing valences. In another particular example, NiO doped with extrinsic ligands may be expressed as NiO(L$_x$), where L$_x$ is a ligand element or compound and x indicates a number of units of the ligand for one unit of NiO. One skilled in the art may determine a value of x for any specific ligand and any specific combination of ligand with NiO or any other transition metal simply by balancing valences.

If sufficient bias is applied (e.g., exceeding a band-splitting potential) and the aforementioned Mott condition is met (injected electron holes=the electrons in a switching region), the CES device may rapidly switch from a conductive state to an insulator state via the Mott transition. This may occur at point 108 of the plot in FIG. 1A. At this point, electrons are no longer screened and become localized. This correlation may result in a strong electron-electron interaction potential which splits the bands to form an insulator. While the CES device is still in the insulative state, current may generated by transportation of electron holes. If enough bias is applied across terminals of the CES, electrons may be injected into a metal-insulator-metal (MIM) diode over the potential barrier of the MIM device. If enough electrons have been injected and enough potential is applied across terminals to place the CES device in a set state, an increase in electrons may screen electrons and remove a localization of electrons, which may collapse the band-splitting potential forming a metal.

According to an embodiment, current in a CES device may be controlled by an externally applied "compliance" condition determined based, at least in part, on the external current limited during a write operation a write operation to place the CES device in conductive state. This externally applied compliance current may also set a condition of a current density for a subsequent reset operation to place the CES in an insulative state. As shown in the particular implementation of FIG. 1A, a current density J$_{comp}$ applied during a write operation at point 116 to place the CES device in an conductive state may determine a compliance condition for placing the CES device in an insulative state in a subsequent write operation. As shown, the CES device may be subsequently placed in an insulative state by application of a current density J$_{reset}$≥J$_{comp}$ at a voltage V$_{reset}$ at point 108, where J$_{comp}$ is externally applied.

The compliance therefore may set a number of electrons in a CES device which are to be "captured" by holes for the Mott transition. In other words, a current applied in a write operation to place a CES device in a conductive memory state may determine a number of holes to be injected to the CES device for subsequently transitioning the CES device to an insulative memory state.

As pointed out above, a reset condition may occur in response to a Mott transition at point 108. As pointed out above, such a Mott transition may occur at condition in a CES device in which a concentration of electrons n equals a concentration of electron holes p. This condition may be modeled according to expression (1) as follows:

$$\lambda_{TF} n^{\frac{1}{3}} = C \sim 0.26 \qquad (1)$$
$$n = \left(\frac{C}{\lambda_{TF}}\right)^3$$

where:
$\lambda_{TF}$ is a Thomas Fermi screening length; and
C is a constant.

According to an embodiment, a current or current density in a region 104 of the plot shown in FIG. 1A may exist in response to injection of holes from a voltage signal applied across terminals of a CES device. Here, injection of holes may meet a Mott transition criterion for the conductive state to insulative state transition at current I$_{MI}$ as a critical voltage V$_{MI}$ is applied across terminals of CES device. This may be modeled according to expression (2) as follows:

$$I_{MI}(V_{MI}) = \frac{dQ(V_{MI})}{dt} \approx \frac{Q(V_{MI})}{t} \qquad (2)$$
$$Q(V_{MI}) = qn(V_{MI})$$

Where Q(V$_{MI}$) is the charged injected (hole or electron) and is a function of an applied voltage.

Injection of electron holes to enable a Mott transition may occur between bands and in response to critical voltage V$_{MI}$ and critical current I$_{MI}$. By equating electron concentration n with a charge concentration to bring about a Mott transition by holes injected by I$_{MI}$ in expression (2) according to expression (1), a dependency of such a critical voltage V$_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$
$$J_{reset}(V_{MI}) = J_{MI}(V_{MI}) = \frac{I_{MI}(V_{MI})}{A_{CeRam}} = \frac{q}{A_{CeRam}t}\left(\frac{C}{\lambda_{TF}(V_{MI})}\right)^3$$

Where:
$A_{CeRam}$ is a cross-sectional area of a CES element; and
$J_{reset}(V_{MI})$ is a current density through the CES element to be applied to the CES element at a critical voltage $V_{MI}$ to place the CES element in an insulative state.

According to an embodiment, a CES element may be placed in a conductive memory state (e.g., by transitioning from an insulative memory state) by injection of a sufficient number of electrons to satisfy a Mott transition criteria In transitioning a CES to a conductive memory state, as enough electrons have been injected and the potential across terminal of the CES device overcomes a critical switching potential (e.g., $V_{set}$), injected electrons begin to screen and unlocalize double-occupied electrons to reverse a disproportion reaction and closing the bandgap. A current density $J_{set}(V_{MI})$ for transitioning the CES to the conductive memory state at a critical voltage $V_{MI}$ enabling transition to the conductive memory state may be expressed according to expression (4) as follows:

$$I_{MI}(V_{MI}) = \frac{dQ(V_{MI})}{dt} \approx \frac{Q(V_{MI})}{t} \quad (4)$$

$$Q(V_{MI}) = qn(V_{MI})$$

$$I_{MI}(V_{MI}) = \frac{Q(V_{MI})}{t} = \frac{qn(V_{MI})}{t} = \frac{q}{t}\left(\frac{C}{a_B}\right)^3$$

$$J_{set}(V_{MI}) = J_{injection}(V_{MI}) = J_{MI}(V_{MI}) = \frac{I_{MI}(V_{MI})}{A_{CeRam}} = \frac{q}{A_{CeRam}t}\left(\frac{C}{a_B}\right)^3$$

where:
$a_B$ is a Bohr radius.

According to an embodiment, a "read window" 102 for detecting a memory state of a CES device in a read operation may be set out as a difference between a portion 106 the plot of FIG. 1A while the CES device is in an insulative state and a portion 104 of the plot FIG. 1A while the CES device is in a conductive state at a read voltage $V_{read}$. In a particular implementation, read window 102 may be used to determine a Thomas Fermi screening length $\lambda_{TF}$ of material making up the CES device. For example, at a voltage $V_{reset}$, current densities $J_{reset}$ and $J_{set}$ may be related to according to expression (5) as follows:

$$\lambda_{TF}(@V_{reset}) = a_B\left(\frac{J_{reset}}{J_{off}}\right)^{\frac{1}{3}} \quad (5)$$

In another embodiment, a "write window" 110 for placing a CES device in an insulative or conductive memory state in a write operation may be set out as a difference between $V_{reset}$ (at $J_{reset}$) and $V_{set}$ (at $J_{set}$). Establishing $|V_{set}|>|V_{reset}|$ enables a switch between conductive and insulative state. $V_{reset}$ may be approximately at a band splitting potential arising from correlation and $V_{set}$ may be approximately twice the band splitting potential. In particular implementations, a size of write window 110 may be determined, at least in part, by materials and doping of the CES device.

Figure 1B:
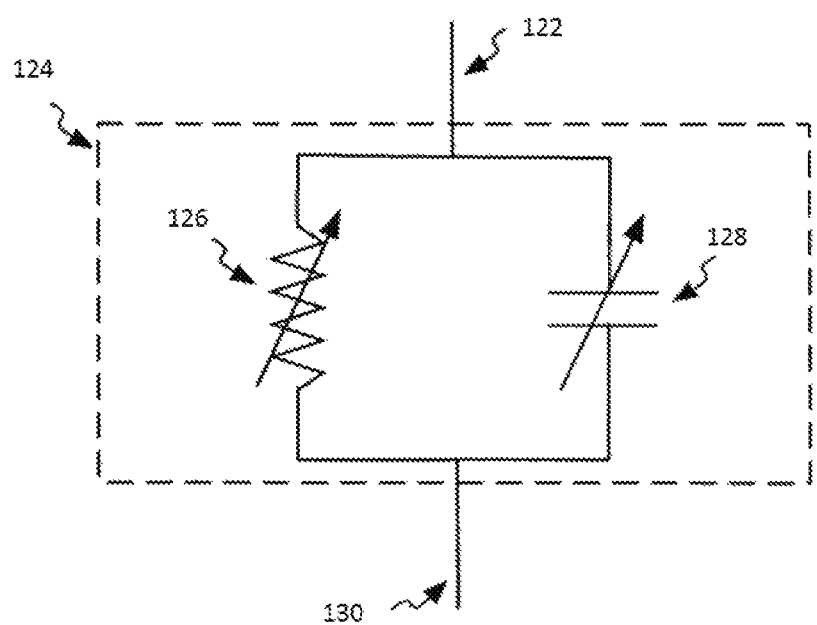
FIG. 1B is a schematic diagram of an equivalent circuit to a CES device according to an embodiment.

The transition from high resistance/capacitance to low resistance/capacitance in a CES device may be represented by a singular impedance of the CES device. FIG. 1B depicts a schematic diagram of an equivalent circuit of an example variable impeder device (such as a CES device), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Of course, although a variable resistor 126 and variable capacitor 128 are depicted in FIG. 1B as comprising discrete components, a variable impeder device, such as variable impeder device 124, may comprise a substantially homogenous CEM, wherein the CEM comprises characteristics of variable capacitance and variable resistance. Table 1 below depicts an example truth table for an example variable impeder device, such as variable impeder device 100.

TABLE 1

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

Particular implementations discussed below are directed a bitcell circuit comprising one or more memory elements (e.g., non-volatile memory elements) such as a CES device, for example. In this context, a "bitcell" or "bitcell circuit" as referred to herein comprises a circuit or portion of a circuit capable of representing a value, symbol or parameter as a state. For example, a bitcell may comprise one or more memory devices that capable of representing a value, symbol or parameter as a memory state of the memory device. In particular implementations, a bitcell may represent a value, symbol or parameter as a single bit or multiple bits. According to an embodiment, a bitcell circuit may comprise memory elements having a behavior similar to that of a CES device discussed above in connection with FIGS. 1A and 1B. For example, a memory element in a bitcell may be placed in a particular memory state (e.g., a conductive or low impedance memory state, or an insulative or high impedance memory state) by independently controlling voltage and current applied across terminals of the memory element in a "write operation." As discussed below in particular implementations, such a write operation may be executed by application of a signal which is controlled to provide a critical current and voltage across terminals of the memory device to place the memory device in a particular memory state. In another aspect, a memory state of a memory element in bitcell may be detected or sensed in a "read operation." In one non-limiting example of a read operation, a charged bitline may be connected to apply a set voltage across terminals of a device and a response may be measured for detection of a current memory state of the device. In this context, a "bitline" comprises a conductor that is connectable to at least one terminal of a memory element during a write operation to transmit a signal altering a memory state of the memory element, or during a read operation to transmit a signal indicative of a current memory state of the memory element. An output signal in a read operation may have a voltage or current that is indicative of a current memory state of a bitcell (e.g., as a "1," "0" or other symbol, value, condition, etc.). In one aspect of a read operation, to detect a current memory state of a memory element, a voltage of a signal applied across terminals of the memory element in a bitcell may be controlled so as to not detectably alter a current memory state of the memory element.

As pointed out above in FIG. 1A, a memory state of a CES device may be changed or determined based on a particular voltage and current. For example, applying a programming signal having a voltage $V_{reset}$ and a sufficient current $I_{reset}$ may place a CES device of a bitcell in an insulative or high impedance memory state. Likewise, applying a programming signal having a voltage $V_{set}$ and a sufficient current $I_{set}$ may place a CES device of a bitcell in a conductive or low impedance memory state. As may be observed from FIG. 1A, that while a magnitude of voltage $V_{set}$ is greater than a magnitude of voltage $V_{reset}$, a magnitude of current $I_{set}$ is lower than a magnitude of current $I_{reset}$.

In particular, a write operation is described as a particular process of placing a memory device such as a CES element in a particular memory state of a plurality of predetermined memory states by applying a "programming signal" to terminals of the memory device. Particular ones of the predetermined memory states may correspond to particular voltage levels to be applied to the memory device (e.g., $V_{set}$ and $V_{reset}$). Similarly, particular ones of the predetermined memory states may correspond to particular current levels to be applied to the memory device (e.g., $I_{set}$ and $I_{reset}$). Accordingly, in a particular embodiment, a programming signal to place a memory device in a particular memory state in a write operation may be controlled to have a particular voltage level and current level corresponding to the particular memory state.

As described in a particular implementation below, a voltage signal having a voltage level for a programming signal to place a memory device in a predetermined memory state may be selected at a multiplexer circuit based, at least in part, on a data signal. Conducting elements connected to the multiplexer may selectively connect a voltage signal to or disconnect a voltage signal from the memory device at a current level corresponding to the predetermined memory state based, at least in part, on the data signal. In this context, a "conducting element" comprises a circuit element capable of permitting current to pass between two nodes. In a particular implementation, a conducting element may vary a current permitted to pass between nodes based, at least in part, on a particular condition. The particular implementations described below employ FETs as conducting elements to permit current to pass between source and drain terminals based, at least in part, on a voltage applied to a gate terminal. It should be understood, however, that other types of devices such as, a bipolar transistor, diode, variable resistor, etc. may be used as a conducting element, and that claimed subject matter is not limited this respect. In this context, a conducting element having first and second terminals may "connect" the first and second terminals by providing a conductive path between the first and second terminals having a very small or negligible impedance for a particular signal. In one particular example implementation, a conducting element may vary an impedance between the first and second terminals based, at least in part, on a signal provided to a third terminal of the conductive element (e.g., a based on a voltage or current applied to the third terminal). In one aspect, a conducting element may "close" to thereby connect first and second terminals in response to a signal provided on the third terminal. Likewise, a conducting element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

Figure 2:
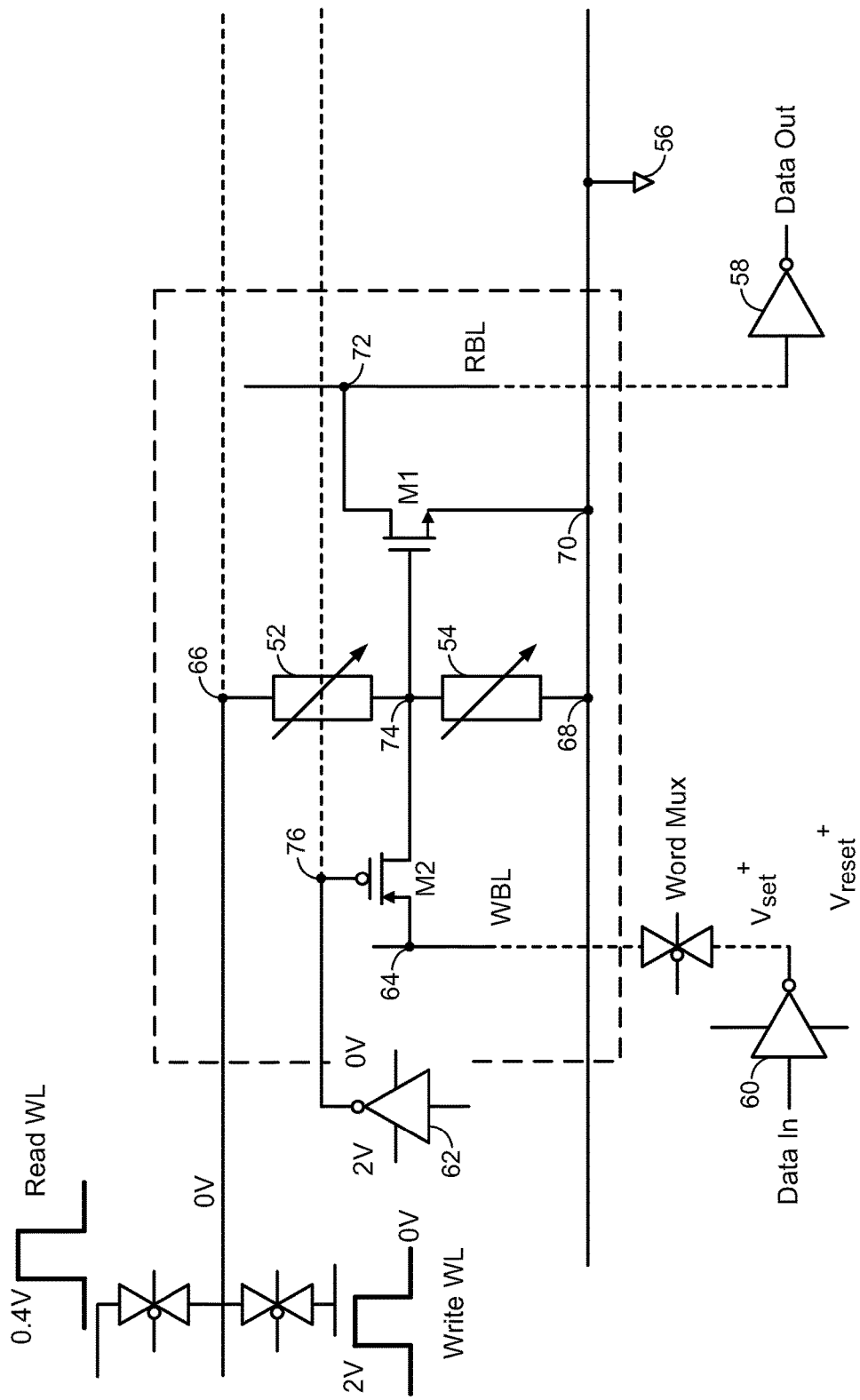
FIG. 2 is a schematic diagram a bitcell according to particular embodiments.

FIG. 2 is a schematic diagram of an architecture for a bitcell according to particular embodiments. Non-volatile memory (NVM) elements 52 and 54 are connected in series at a node 74 between nodes 66 and 68. NVM elements 52 and 54 may be placed in complementary states to represent one of two distinct symbols or values (e.g., "1" or "0," true or false, etc.). To store a first symbol or value in a first mode, NVM element 52 may be placed in a conductive or low impedance memory state while NVM element 54 may be placed in an insulative or high impedance memory state. Similarly, to store a second symbol or value in a second mode, NVM element 52 may be placed in the insulative or high impedance memory state while NVM element 54 may be placed in the conductive or low impedance memory state. Particular examples below are directed to implementations of NVM elements 52 and 54 as CES devices or CeRAM devices. It should be understood, however, that these are merely non-limiting examples of devices that may be used, and that claimed subject matter is not limited in this respect.

As pointed out above, a "non-volatile memory" comprises an integrated circuit device in which a memory cell or element maintains its memory state (e.g., a conductive or low impedance memory state, or an insulative or high impedance memory state) after power supplied to the device is removed. In this context, a "wordline" comprises a conductor for transmitting a signal to select a particular bitcell or group of bitcells to be accessed in a read operation or a write operation. In a particular example implementation, a voltage of a signal on a wordline may be raised or lowered to select or deselect a particular bitcell or group of bitcells to be connected to a corresponding bitline or group of bitlines during a read or write operation. It should be understood, however, that this is merely an example of a wordline and that claimed subject matter is not limited in this respect. Also, in this context, a "reference node" comprises a node in a circuit that is maintained at a particular voltage level or at a particular voltage difference from another node in the circuit. In one example, a reference node may comprise or be connected to a ground node. In other particular implementations, a reference node may be maintained at a particular voltage relative to that of a ground node.

A symbol or value represented by or stored in NVM elements 52 and 54 may be detected in a read operation. In a read operation, a conducting element may disconnect a write bitline WBL from node 74 while a particular voltage (e.g., 0.4V) is maintained between nodes 66 and 68. Here, FET M2 may disconnect node 74 from a bitline WBL in response to a raised voltage (e.g., 2.0V) at a gate of FET M2 provided by a buffer device 62 in response to a voltage of a write wordline signal. A read bitline RBL may be precharged to Vdd prior to commencement of the read operation. It may be observed that the series coupling of NVM elements 52 and 54 between the set voltage maintained between nodes 66 and 68 may behave as a voltage divider. If the first value or symbol is being stored (where NVM element 52 is in the conductive or low impedance memory state and NVM element 54 is the insulative or high impedance memory state), a voltage at node 74 and applied to a gate of FET M1 may be sufficiently high to connect pre-charged read bitline RBL to reference node 56 (e.g., ground). A sense circuit may detect the stored first symbol or value based on a low current level at buffer 58. Similarly, if the second value or symbol is being stored (where NVM element 52 is in the insulative or high impedance memory state and NVM element 54 is the conductive or low impedance memory state), a voltage at node 74 and applied to a gate of FET M1 may be sufficiently low to disconnect pre-charged read bitline RBL from reference node 56. A sense circuit may then detect the stored second symbol or value based on a higher current level at buffer 58.

It should be observed that by applying a voltage at node 66 during a read operation locally (e.g., not from a bitline source), a magnitude of a read current $I_{read}$ between nodes 66 and 74, or between nodes 68 and 74 may be easily controlled so as to not affect a current memory state of NVM element 52 or 54 (and avoid a reset event while in a conductive or high impedance memory state). This may allow for high speed operation and allow for opportunities to further optimize for variability, endurance, standby leakage during active mode, density, ease of integration with a CMOS device, just to provide a few examples.

In a write operation, buffer 62 may generate a low voltage (e.g., 0.0 V) applied to the gate terminal of FET M2 to connect node 74 to write driver 60 (e.g., in response to a lowered voltage applied to the gate terminal of FET M2 in response to a write wordline signal) while a voltage between nodes 68 and 66 is maintained at a particular voltage (e.g., $V_{set}+V_{reset}$ or 4.0V). If the write operation is to store the aforementioned first value or symbol in a write operation, driver device 60 may supply a voltage $V_{reset}$ to node 74 through FET M2 (e.g., while node 68 is maintained at a 0.0V reference) to apply a first programming signal between terminals 74 and 66 having a voltage $V_{set}$ and current $I_{set}$ to place NVM element 52 in the conductive or low impedance memory state. Likewise, application of the voltage $V_{reset}$ to node 74 (e.g., while node 68 is maintained at a 0.0V reference) in a write operation may apply a second programming signal between terminals 68 and 74 having a write operation a voltage $V_{reset}$ and current $I_{reset}$ to place NVM element 52 in the insulative or high impedance memory state.

If a write operation is to store the aforementioned second value or symbol, driver device 60 may supply a voltage $V_{set}$ to node 74 through FET M2 (e.g., while node 68 is maintained at a 0.0V reference) to apply a third programming signal between terminals 74 and 66 having a voltage $V_{reset}$ and current $I_{reset}$ to place NVM element 52 in the insulative or high impedance memory state. Likewise, application of the voltage $V_{set}$ to node 74 (e.g., while node 68 is maintained at a 0.0V reference) may apply a fourth programming signal between terminals 68 and 74 having a write operation a voltage $V_{set}$ and current $I_{set}$ to place NVM element 52 in the conductive or low impedance memory state.

Following a read or write operation, a voltage at node 66 may return to 0.0V (e.g., from 0.4V in a read operation or $V_{set}+V_{reset}$ in a write operation). This allows charge stored in the internal capacitance of NVM elements 52 and 54 to discharge through internal resistance for preparing NVM elements 52 and 54 for a subsequent access, and for permitting faster access times for a subsequent read or write operation. Applying a single voltage for read operations and a single voltage for write operations at node 66 may avoid voltage access complexity of supporting multiple voltage levels for memory element access in other memory cell implementations. Furthermore, current sourced at nodes 66 and 68 may be controlled to provide current $I_{set}$ across NVM element 52 and current $I_{reset}$ across NVM element 54 in a first write operation to place NVM elements 53 and 54 in a first mode, and provide current $I_{reset}$ across NVM element 52 and current $I_{set}$ across NVM element 54 in a complementary second write operation to place NVM elements 52 and 54 in a second mode.

According to an embodiment, the particular implementation of a bitcell in FIG. 2 may be scalable to incorporate multiple like bitcells having a pair of serially coupled NVM elements and sharing terminals (e.g., at nodes 64, 66, 68, 70, 72 and 76). For example, as many as four adjacent bitcells may share four terminals in horizontal pairs (e.g., terminals at nodes 66, 68, 70 and 76), and may share four terminals in vertical pairs (e.g., terminals at nodes 64, 68, 70 and 72).

In a particular implementation, the NVM elements 52 and 54 may comprise CES or CeRAM elements having one or more properties discussed above with reference to FIG. 1 in that $|V_{reset}|<|V_{set}|$ while $|I_{reset}|>|I_{set}|$. Accordingly, in either of the aforementioned write operations, a magnitude of a write voltage in a programming signal to place either NVM element 52 or 54 in a conductive or low impedance memory state may be greater than a magnitude of a write voltage of a programming signal to place either NVM element 52 or 54 in an insulative or high impedance memory state. Also, a magnitude of a write current in a programming signal to place either NVM element 52 or 54 in a conductive or low impedance memory state may be less than a magnitude of a write current of a programming signal to place either NVM element 52 or 54 in an insulative or high impedance memory state.

The second write voltage, and a magnitude of the first write current may be less than a magnitude of the second write current. Following placement of the NVM element in the second memory state, a third voltage (e.g., $V_{read}$) may be applied across the terminals of the NVM element in a read operation to detect a current memory state of the NVM element. While the third voltage is being applied during the read operation, a current between the first and terminals may be limited to less than a magnitude of the first current (e.g., $|I_{read}|<|I_{reset}|$) to maintain the second memory state of the NVM element (e.g., conductive or low impedance memory state).

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

The claims are as follows:

1. A device comprising:
   a plurality of non-volatile memory elements connected in series, the plurality of non-volatile memory elements being operable to:
   store a first symbol or value in a first mode wherein at least a first of the non-volatile memory elements, the first of the non-volatile memory elements comprising a first correlated electron switch (CES), is in a first impedance state and at least a second of the non-volatile memory elements, the second of the non-volatile memory elements comprising a second CES, is in a second impedance state; and
   store a second symbol or value in a second mode wherein at least the second of the non-volatile memory elements is in the first impedance state and at least the first of the non-volatile memory elements is in the second impedance state;
   wherein the first of the non-volatile memory elements comprises first and second terminals and the second of the non-volatile memory elements comprises first and second terminals, wherein the first terminal of the first of the non-volatile memory elements is coupled to the first terminal of the second of the non-volatile memory elements at a node, and wherein the device further comprises:
   a circuit to determine whether the device is in the first mode or the second mode based, at least in part, on a voltage at the node.

2. The device of claim 1, and further comprising:
   a first conducting element configured to connect a voltage source to a first terminal of the first of the non-volatile memory elements and a first terminal of the second of the non-volatile memory elements at the node during a write operation.

3. The device of claim 2, and further comprising a second conducting element configured to, responsive to the voltage at the node, connect a reference node to a charged bit line when the device is in the second mode and disconnect the reference node to the charged bit line when the device is in the first mode.

4. The device of claim 3, wherein the reference node is connected to a ground node.

5. The device of claim 3, wherein the second conducting element comprises an NFET comprising a gate terminal connected to the first terminal of the first non-volatile memory element and the first terminal of the second non-volatile memory element.

6. The device of claim 2, wherein the first conducting element is configured to apply, at least in part, a first programming signal across the first and second terminals of the first non-volatile memory element and apply, at least in part, a second programming signal across the first and second terminals of the second non-volatile memory element during the write operation.

7. The device of claim 6, wherein the first programming signal comprises a first voltage and a first current and wherein the second programming signal comprises a second voltage and a second current, and wherein:
   a magnitude of the first voltage exceeds a magnitude of the second voltage and a magnitude of the second current exceeds a magnitude of the first current to place the device in the first impedance state; and
   the magnitude of the second voltage exceeds the magnitude of the first voltage and the magnitude of the first current exceeds the magnitude of the second current to place the device in the second impedance state.

8. The device of claim 2, wherein the first conducting element comprises a PFET to connect the voltage source to the first terminal of the first of the non-volatile memory elements and the first terminal of the second of the non-volatile memory elements during the write operation in response to a wordline voltage applied to a gate terminal of the PFET.

9. The device of claim 1, wherein the first and second of the non-volatile memory elements comprise a correlated electron material (CEM), the first and second of the non-volatile memory elements being configurable to be in at least the first impedance state or the second impedance state based, at least in part, on a screening length of the CEM and responsive to localization properties of electrons in the CEM.

10. The device of claim 1, and further comprising a circuit to:
   apply a first voltage between the second terminal of the first of the non-volatile memory elements and the second terminal of the second of the non-volatile memory elements, and apply a second voltage at the node to place the device in the first mode; and
   apply the first voltage between the second terminal of the first of the non-volatile memory elements and the second terminal of the second of the non-volatile memory elements, and apply a second voltage at the node to place the device in the second mode.

11. A device comprising:
   a plurality of non-volatile memory elements connected in series, the plurality of non-volatile memory elements being operable to:
   store a first symbol or value in a first mode wherein at least a first of the non-volatile memory elements is in a first impedance state and at least a second of the non-volatile memory elements is in a second impedance state; and
   store a second symbol or value in a second mode wherein at least the second of the non-volatile memory elements is in the first impedance state and at least the first of the non-volatile memory elements is in the second impedance state;
   wherein the first of the non-volatile memory elements comprises first and second terminals and the second of the non-volatile memory elements comprises first and second terminals, wherein the first terminal of the first of the non-volatile memory elements is coupled to the first terminal of the second of the non-volatile memory elements at a node, and wherein the device further comprises:
   a circuit to determine whether the device is in the first mode or the second mode based, at least in part, on a voltage at the node,
   wherein the first non-volatile memory element comprises a first correlated electron random access memory (CeRAM) element and the second non-volatile memory element comprises a second CeRAM element.

12. A method comprising:
   connecting a first bitline to a first terminal of a first non-volatile memory element and to a first terminal of a second non-volatile memory element in a first write operation to store a first symbol or value, the first and second non-volatile memory elements comprising a correlated electron material (CEM), the first and second non-volatile memory elements being configurable to be in at least a first impedance state or a second impedance state based, at least in part, on a screening length of the CEM and responsive to localization properties of electrons in the CEM, the non-volatile memory elements being connected in series and being operable to store the first symbol or value in a first mode having the first non-volatile memory element in the first impedance state and the second non-volatile memory element in the second impedance state, and being operable to store a second symbol or value in a second mode having the first non-volatile memory element in the second impedance state and the second non-volatile memory element in the first impedance state.

13. The method of claim 12, and further comprising:

applying a first programming signal across the first terminal of the first non-volatile memory element and a second terminal of the first non-volatile memory element in the first write operation to place the first non-volatile memory element in the first impedance state; and applying a second programming signal across the first terminal of the second non-volatile memory element and a second terminal of the second non-volatile memory element in the first write operation to place the second non-volatile memory element in the second impedance state.

14. The method of claim 13, wherein a magnitude of a first write current of the first programming signal is greater than a magnitude of a first write current of the second programming signal, and wherein a magnitude of a first write voltage of the first programming signal is less than a magnitude of a second write voltage of the second programming signal.

15. The method of claim 14, and further comprising:

connecting the first bitline to the first terminal of the first non-volatile memory element and to the first terminal of the second non-volatile memory element in a second write operation to store the second symbol or value, the second write operation applying a third programming signal across the first terminal of the first non-volatile memory element and the second terminal of the first non-volatile memory element to place the first non-volatile memory element in the second impedance state, the second write operation applying a fourth programming signal across the first terminal of the second non-volatile memory device and the second terminal of the second non-volatile memory element to place the second non-volatile memory element in the first impedance state.

16. The method of claim 15, wherein a magnitude of a third write current of the third programming signal is less than a magnitude of a third write current of the fourth programming signal, and wherein a magnitude of a fourth write voltage of the third programming signal is less than a magnitude of a fourth write voltage of the fourth programming signal.

17. The method of claim 12, wherein the first non-volatile memory element comprises a first CeRAM element and the second non-volatile memory element comprises a second CeRAM element.

18. The method of claim 12, and further comprising disconnecting a second bitline from a reference node in a read operation in response to a voltage at the first terminal of the first non-volatile memory element and the first terminal of the second non-volatile memory element.

19. The method of claim 12, and further comprising connecting a second bitline to a reference node in a read operation in response to a voltage at the first terminal of the first non-volatile memory element and the first terminal of the second non-volatile memory element.

20. The method of claim 19, and further comprising maintaining a set voltage between the second terminal of the first non-volatile memory element and the second terminal of the second non-volatile memory element during the read operation.

21. The method of claim 12, wherein the first non-volatile memory element comprises a first correlated electron switch (CES) element and the second non-volatile memory element comprises a second CES element.

* * * * *